United States Patent
Wu (10) Patent No.: US 9,212,690 B2
(45) Date of Patent: Dec. 15, 2015

(54) ELECTRICAL CYLINDER CONTROLLER WITH ROTATIONAL MECHANISM

(71) Applicant: TIMOTION TECHNOLOGY CO., LTD., New Taipei (TW)

(72) Inventor: Chou-Hsin Wu, New Taipei (TW)

(73) Assignee: TIMOTION TECHNOLOGY CO., LTD., New Taipei (TW)

(*) Notice: Subject to any disclaimer, the term of this patent is extended or adjusted under 35 U.S.C. 154(b) by 375 days.

(21) Appl. No.: 13/747,014

(22) Filed: Jan. 22, 2013

(65) Prior Publication Data

US 2014/0178124 A1  Jun. 26, 2014

(30) Foreign Application Priority Data

Dec. 21, 2012  (TW) .............................. 101224878 A (51) Int. Cl.
*F16C 11/04* (2006.01)
*H05K 5/00* (2006.01)

(52) U.S. Cl.
CPC .............. *F16C 11/04* (2013.01); *H05K 5/0017* (2013.01); *Y10T 403/32606* (2015.01)

(58) Field of Classification Search
CPC ............... Y10T 403/32557; Y10T 403/32541; Y10T 403/32549; Y10T 403/32606; Y10T 403/32614; Y10T 403/32983; Y10T 403/32819; Y10T 403/32827; Y10T 403/32114; Y10T 403/32213; Y10T 403/7021; Y10T 403/7022; Y10T 403/7039; Y10T 403/7047; Y10T 403/7051; Y10T 403/32581; Y10T 403/32591; Y10T 403/32975; Y10T 403/3298; F16C 11/04
See application file for complete search history.

(56) References Cited

U.S. PATENT DOCUMENTS

| 7,170,427 B2* | 1/2007 | Hsu ................................. 341/20 |
| 7,792,555 B2* | 9/2010 | Kawasaki et al. ........... 455/575.3 |
| 2008/0001866 A1* | 1/2008 | Martin ............................ 345/84 |
| 2010/0229304 A1* | 9/2010 | Heimbrock et al. ............. 5/425 |
| 2011/0043990 A1* | 2/2011 | Mickey et al. ........... 361/679.04 |
| 2011/0075335 A1* | 3/2011 | Nagami ................... 361/679.01 |

* cited by examiner

*Primary Examiner* — Daniel P Stodola
*Assistant Examiner* — Matthieu Setliff
(74) *Attorney, Agent, or Firm* — Chun-Ming Shih; HDLS IPR Services (57) ABSTRACT

An electrical cylinder controller with a rotational mechanism includes a box, a pivotal element, a fixing element, and a damping member; one end of the box has a hollow tube, the hollow tube internally has a restricting block; the pivotal element penetrates through the hollow tube, the pivotal element has a pivotal-connecting section and a protruding section elongating from the pivotal-connecting section, the external portion of the protruding section has a stopping block against the restricting block; the fixing element connects to the end portion of the protruding section; and the damping member female-connects to the external portion of the protruding section and is clamped between the hollow tube and the fixing element. Therefore, the effect of applying a force to the box for rotation is achieved.

19 Claims, 9 Drawing Sheets

FIG.11

ELECTRICAL CYLINDER CONTROLLER WITH ROTATIONAL MECHANISM

This application is based on and claims priority from Taiwan Application No. 101224878, filed Dec. 21, 2012, the disclosure of which is hereby incorporated by reference herein in its entirety.

BACKGROUND OF THE INVENTION

1. Field of the Invention

The present invention generally relates to a controller, more particular to an electrical cylinder controller with a rotational mechanism.

2. Description of Related Art

General electric hospital bed uses a controller to control the length of the adjustable rod of an actuator so as to adjust the angle of the bed. Thus the controller is disposed above the bed for the conveniences of medical personnel or a patient.

Prior controller disposed above the bed comprises a box, a control module and a flexible plate member; the control module is in the box, the flexible plate member is disposed on the one side of the box and is corresponding to the touchable switch of the control module, so that the effect of pressing the flexible plate member to operate the linear actuator is achieved.

However, the shortcomings of the related art are listed below:

1. Due to the box being irrotational, medical personnel or a patient must operate the controller according to the angle of the controller, which interrupts a diagnosis or causes inconvenience to other operations.

2. Due to the controller not providing light, to install lamps is a must while in diagnostic or other operations, but such lamps occupies much space.

SUMMARY OF THE INVENTION

The main object of the present invention provides an electrical cylinder controller with a rotational mechanism, which uses the pivotal connection of a pivotal element and a hollow tube so as to apply a force to a box for rotation.

To reach above object, the electrical cylinder controller with a rotational mechanism provided by the present invention has a box, a pivotal element, a fixing element, and a damping member; one end of the box has a hollow tube, the hollow tube internally has a restricting block; the pivotal element penetrates through the hollow tube, the pivotal element has a pivotal-connecting section and a protruding section elongating from the pivotal-connecting section, the external portion of the protruding section has a stopping block against the restricting block; the fixing element connects to an end portion of the protruding section; and the damping member female-connects to the external portion of the protruding section and is clamped between the hollow tube and the fixing element.

The advantages of the present invention are listed below:

1. Through the restricting block of the hollow tube and the stopping block of the pivotal-connecting section being against to each other, the angle of the rotation, corresponding to the pivotal element, of the box being over 360° is prevented, so that the electric line may not be over twisted to damage.

2. By way of the box being in a rotation, relative to the pivotal element, in any angle, the box of the controller is able to rotate to a suitable angle for the conveniences of medical personnel or patients.

3. For the damping member being clamped between the box and the fixing element, the force applied to the box is greater than the friction force between the damping member and the inner wall of the accommodating room or the friction force between the damping member and the fixing element, thus the box is just in a rotation relative to the pivotal element, and therefore it avoids that the box arbitrarily rotates while the medical personnel press the pressing portion of the flexible plate member.

4. For the design of the light module, additional space for lamps and lanterns can then be saved.

5. The light emitted from the light units of the light module going out through the transmittance mask 80 is uniformed in order to avoid glare or intensive light.

6. Via the flexible ring circle, mist going into the accommodating space through the gaps of the hollow tube and the pivotal-connecting section is now avoided. Hence the control board and the printed circuit board touching mist to cause corrosion and damage is prevented as well so as to promote life.

DETAILED DESCRIPTION OF THE INVENTION

Other and further features, advantages, and benefits of the invention will become apparent in the following description taken in conjunction with the following drawings. It is to be understood that the foregoing general description and following detailed description are exemplary and explanatory but are not to be restrictive of the invention. The accompanying drawings are incorporated in and constitute a part of this application and, together with the description, serve to explain the principles of the invention in general terms. Like numerals refer to like parts throughout the disclosure.

Figure 1:
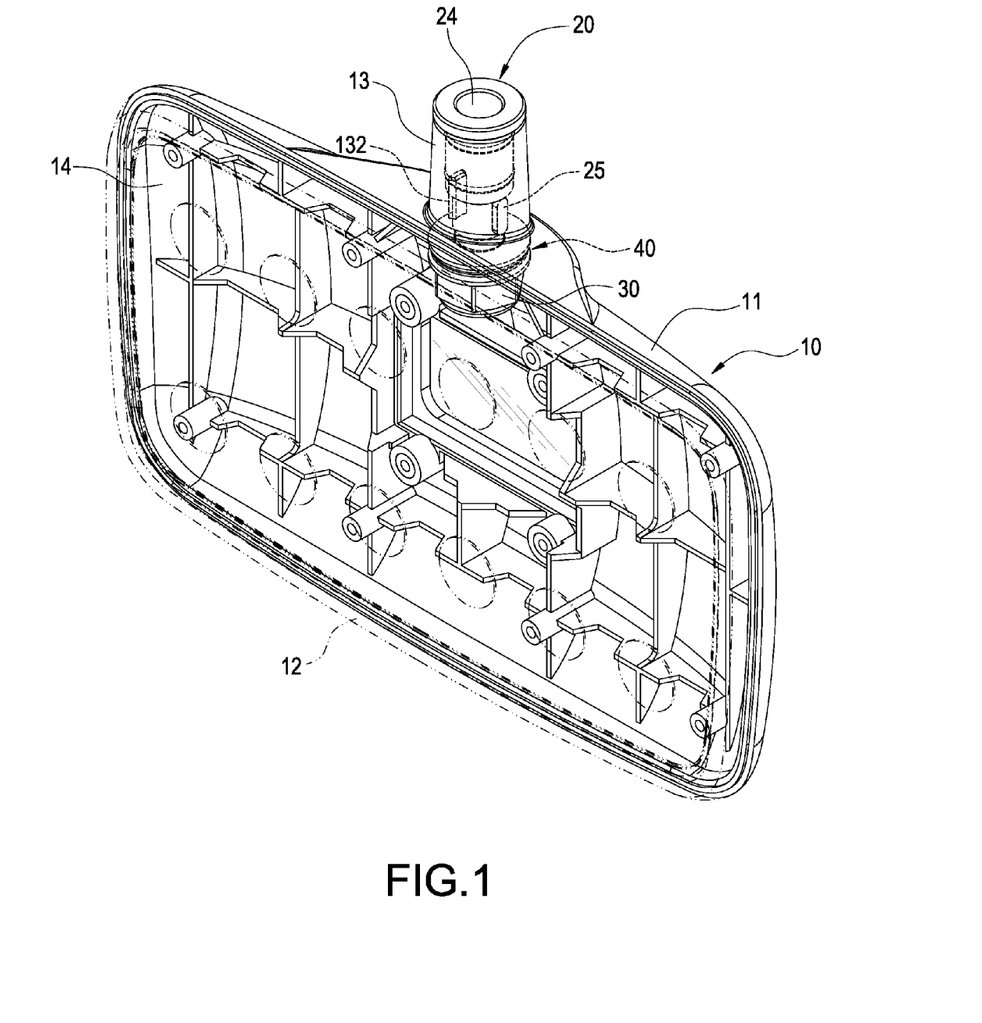
FIG. 1 illustrates a schematic 3-D view of the electrical cylinder controller with the rotational mechanism of the present invention.
Figure 2:
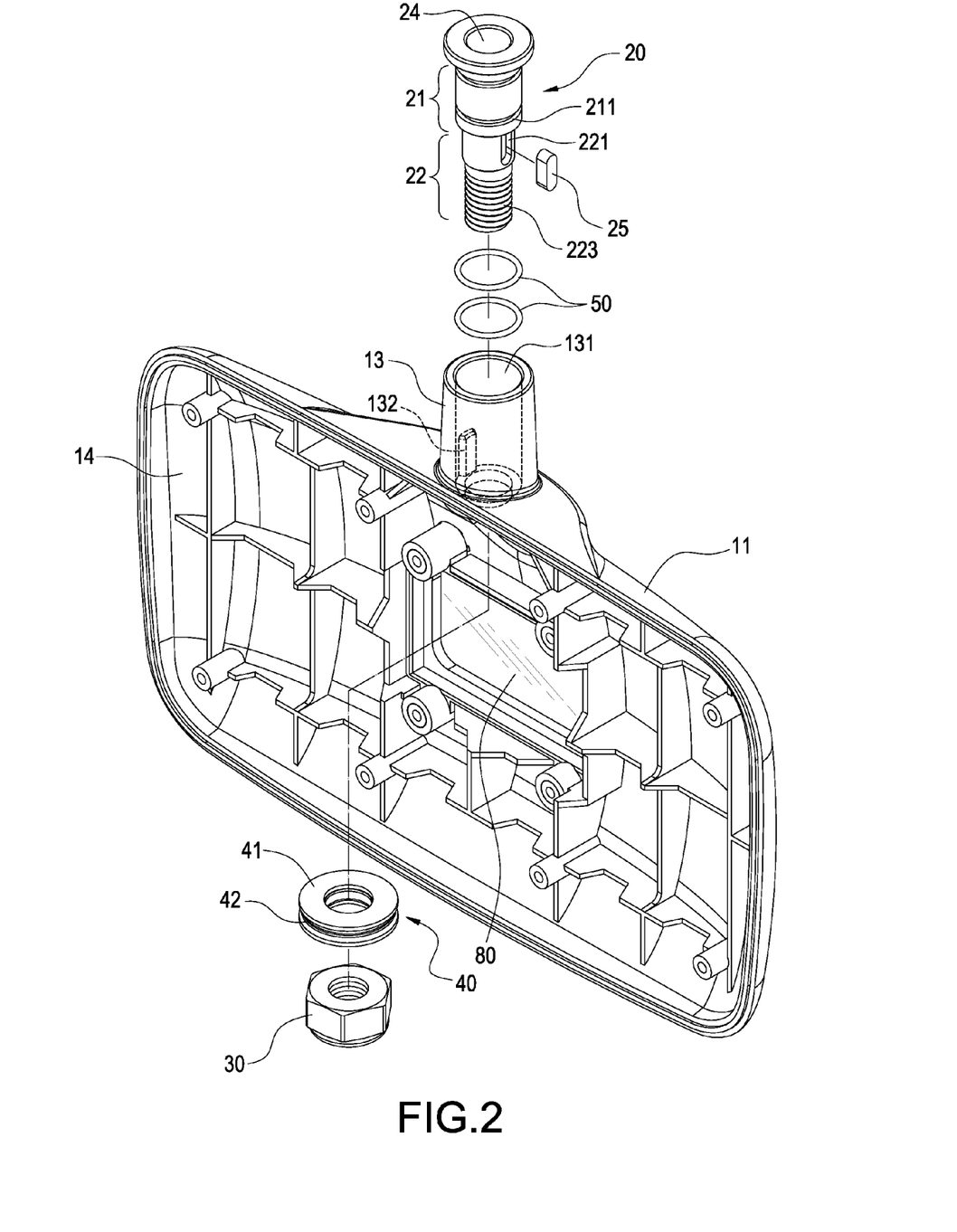
FIG. 2 illustrates a schematic exploded view of the electrical cylinder controller with the rotational mechanism of the present invention.
Figure 3:
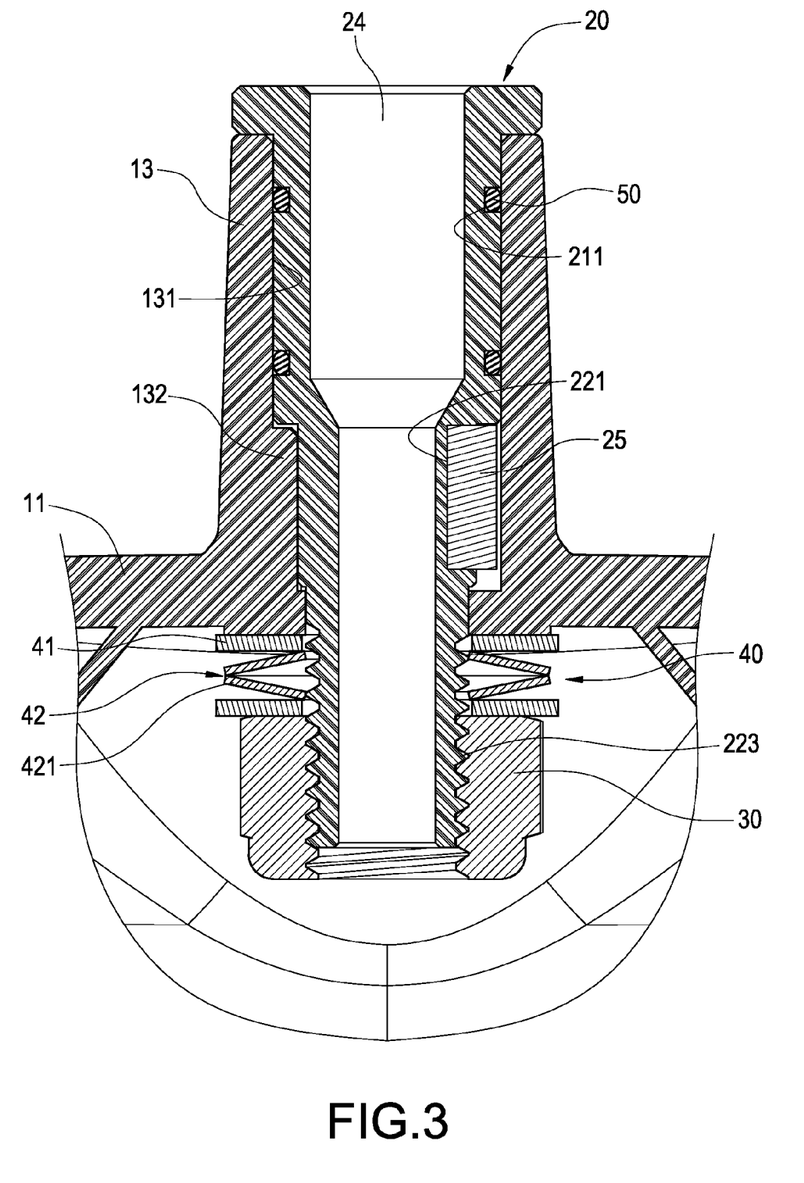
FIG. 3 illustrates a schematic view of the electrical cylinder controller with the rotational mechanism of the present invention.
Figure 4:
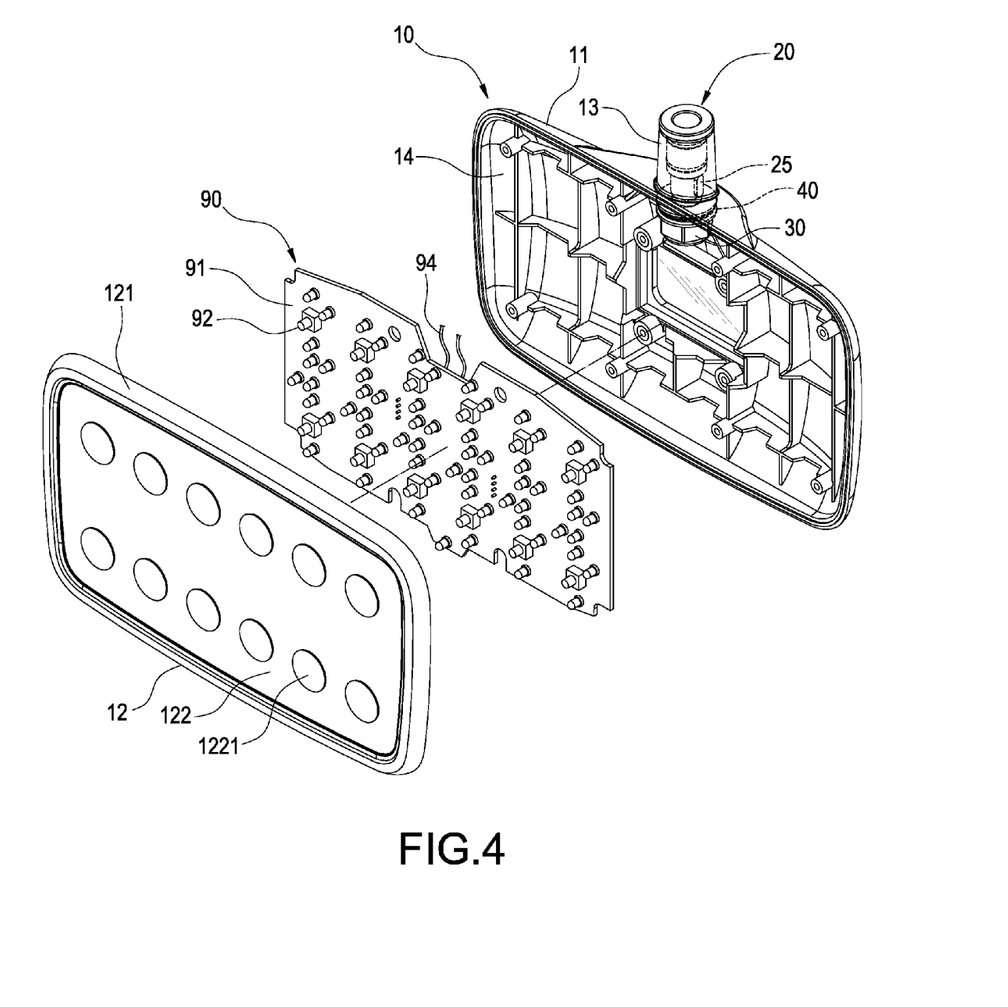
FIG. 4 illustrates a schematic 3-D exploded view of the electrical cylinder controller with the rotational mechanism of the present invention.
Figure 5:
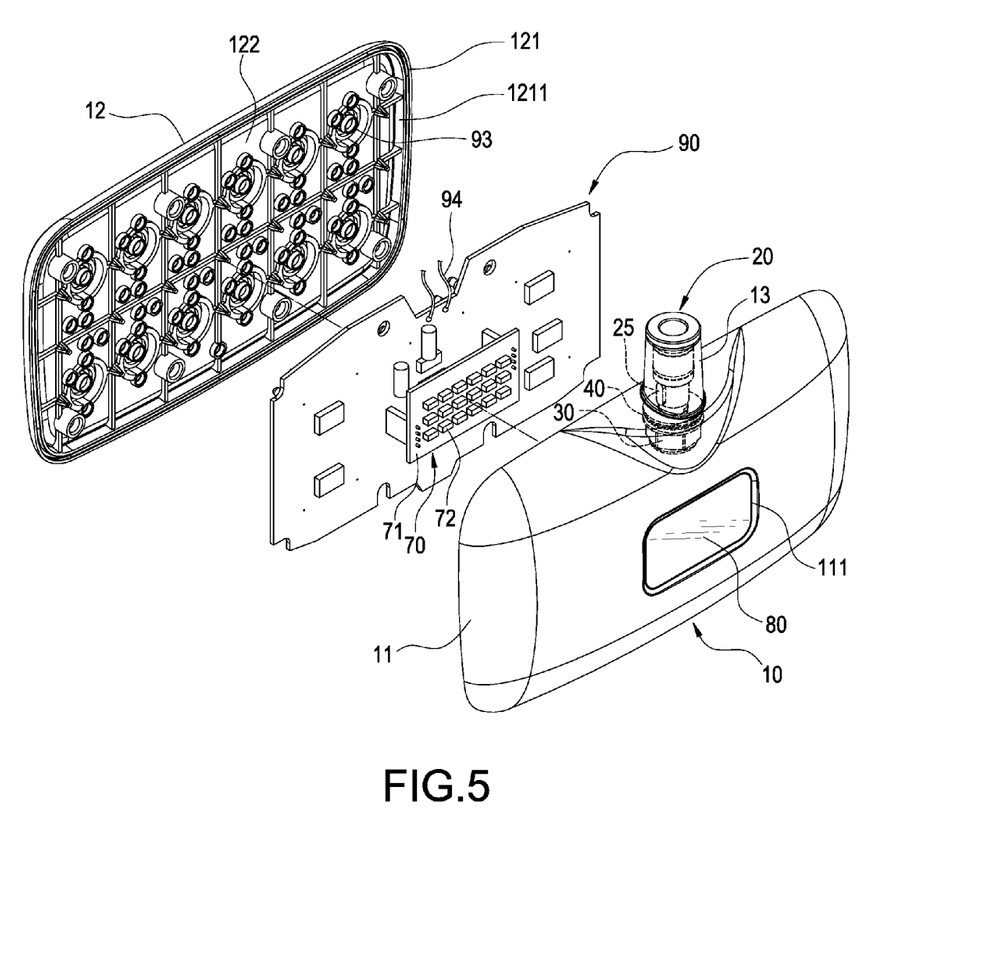
FIG. 5 illustrates another schematic 3-D exploded view of the electrical cylinder controller with the rotational mechanism of the present invention.
Figure 6:
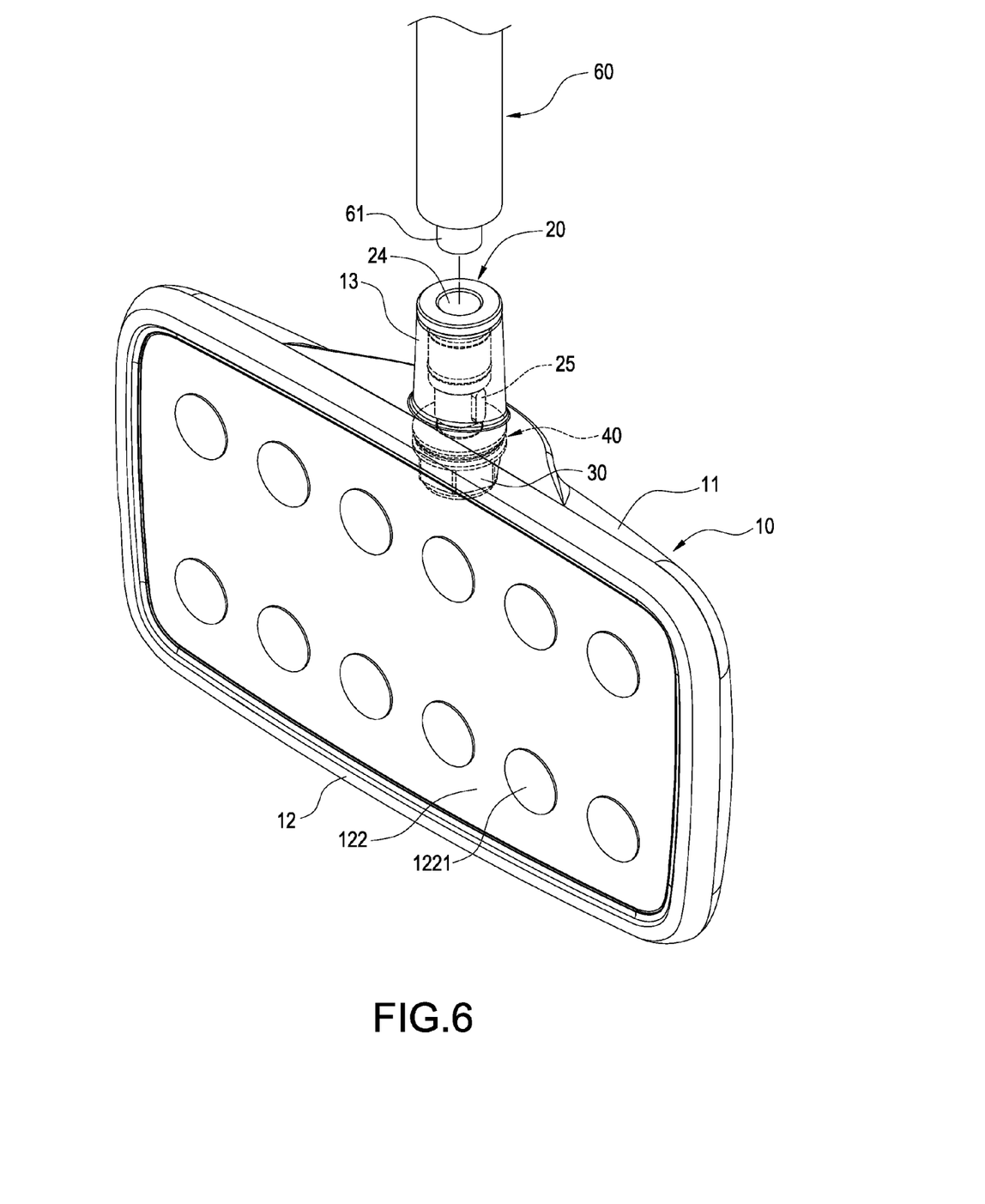
FIG. 6 illustrates a schematic 3-D partial exploded view of the electrical cylinder controller with the rotational mechanism of the present invention.
Figure 7:
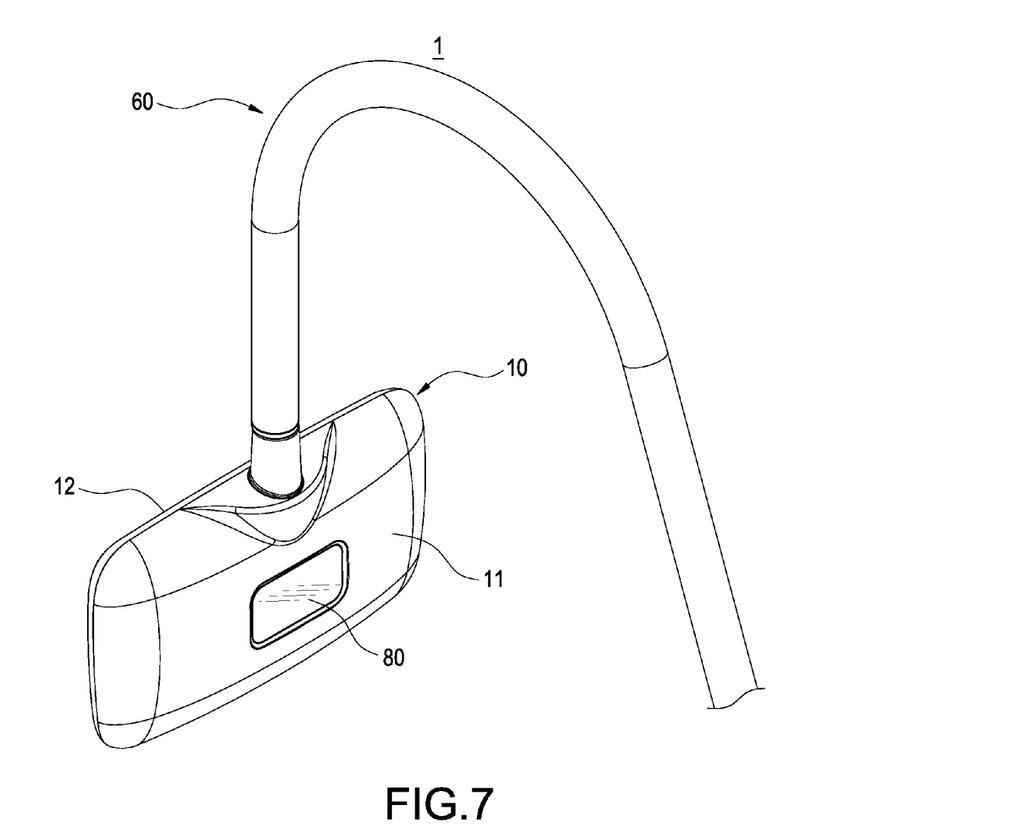
FIG. 7 illustrates a schematic assembly view of the electrical cylinder controller with the rotational mechanism of the present invention.
Figure 8:
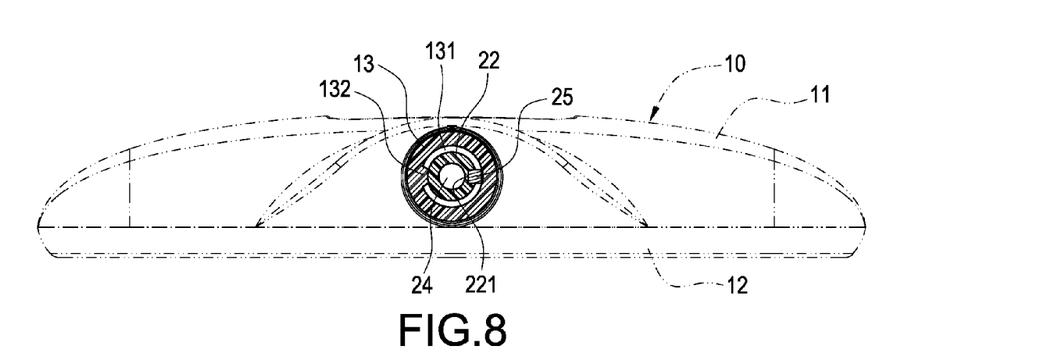
FIG. 8 illustrates a schematic view of an operation status 1 of the electrical cylinder controller with the rotational mechanism of the present invention.
Figure 9:
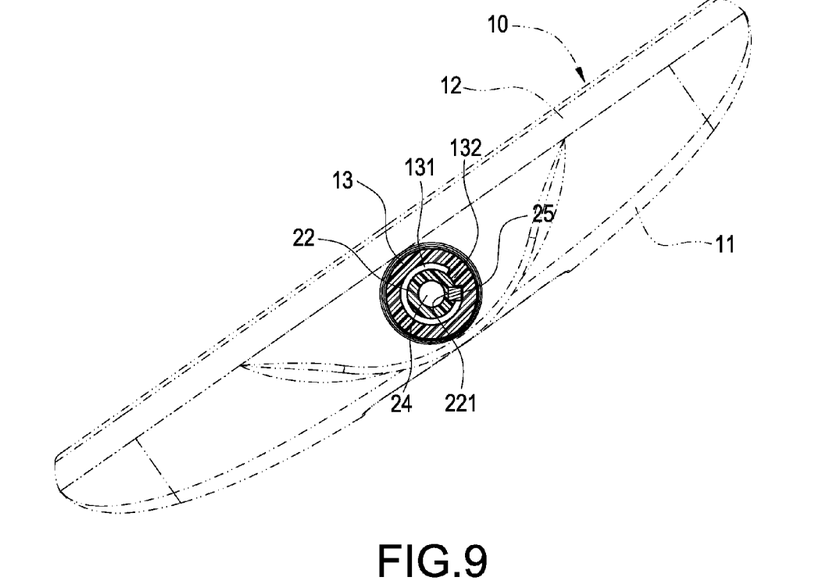
FIG. 9 illustrates a schematic view of an operation status 2 of the electrical cylinder controller with the rotational mechanism of the present invention.
Figure 10:
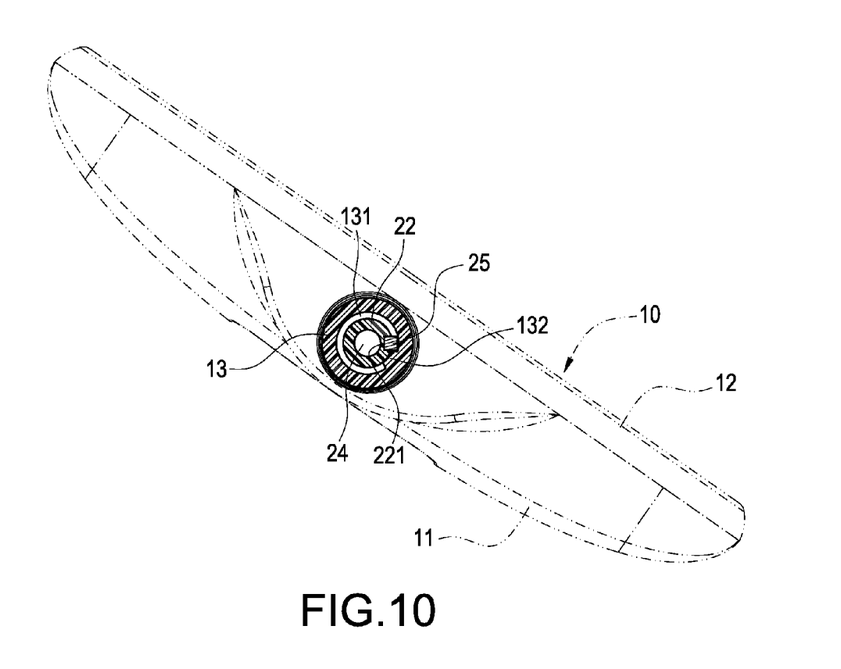
FIG. 10 illustrates a schematic view of an operation status 3 of the electrical cylinder controller with the rotational mechanism of the present invention.
Figure 11:
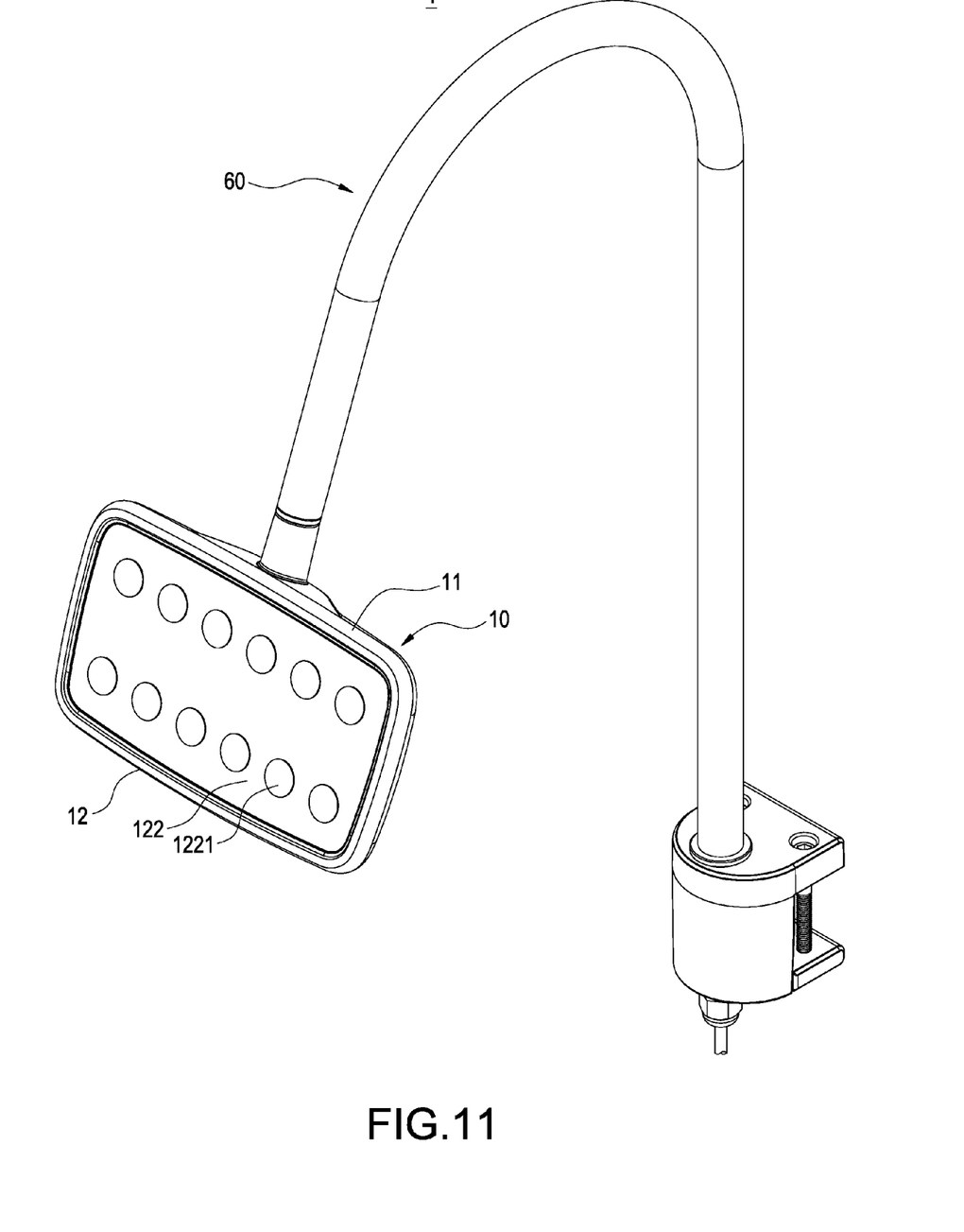
FIG. 11 illustrates a schematic view of an operation status 4 of the electrical cylinder controller with the rotational mechanism of the present invention.

Please refer to FIG. 1 to FIG. 3, which illustrates a schematic 3-D view of the electrical cylinder controller with the rotational mechanism of the present invention, a schematic exploded view of the electrical cylinder controller with the rotational mechanism of the present invention and a schematic view of the electrical cylinder controller with the rotational mechanism of the present invention. The electrical cylinder controller 1 with the rotational mechanism provided by the present invention mainly includes: a box 10, a pivotal element 20, a fixing element 30, and a damping member 40.

The box 10 includes a first case 11, a second case 12, a hollow tube 13; the second case 12 is corresponding to the first case 11 for covering; an accommodating room 14 is between the first case 11 and the second case 12; the first case (11) has an open 111 communicating with the accommodating room 14; the hollow tube 13 elongates from one end of the first case 11 and has a hollow channel 131 connecting through the accommodating room 14, a restricting block 132 elongates from the inner wall of the hollow channel 131; the second case 12 has a ring frame 121 and a flexible plate member 122, the peripheral of the ring frame 121 forms a compartment space 1211, the flexible plate member 122 connects to the ring frame 121 corresponding to the compartment space 1211, a plurality of pressing portions 1221 are on one side surface, away from the ring frame 121, of the flexible plate member 122.

The pivotal element 20 has a pivotal-connecting section 21, a protruding section 22, a through channel 24, and a stopping block 25; the pivotal element 20 pivotally connects to the hollow channel 131 of the hollow tube 13, the external surface of the pivotal-connecting section 21 has at least one ring slot 211, the outer surface of the protruding section 22, elongating from the pivotal-connecting section 21, has a slot 221, one side of the stopping block 25 embeds in the slot 221 of the protruding section 22, the other side of the stopping block 25 is against the restricting block 132 of the hollow tube 13; an end portion of the protruding section 22 in the accommodating room 14 of the box 10 is shaped as an outer thread 223; the through channel 24 penetrates through the internal of the pivotal element 20 along the pivotal-connecting section 21 and the protruding section 22, and the through channel 24 connects through the accommodating room 14 of the box 10.

The fixing element 30 is disposed in the accommodating room 14 of the box 10 and female-connects to the external portion of the protruding section 22 of the pivotal element 20, and the fixing element 30 and the outer thread 223 of the protruding section 22 are screwed to each other; further, the fixing element 30 is a nut.

The damping member 40 is in the accommodating room 14 of the box 10 and female-connects to the external portion of the protruding section (22) and is clamped between the box 10 and the fixing element 30; the damping member 40 has a pair of ring plates 41 corresponding to each other and a spring 42 clamped between the two ring plates 41, the ring plates 41 connect to the inner wall, adjacent to the hollow tube 13, of the accommodating room 14 and a side surface, adjacent to the hollow tube 13, of the fixing element 30; the spring 42 is a belleville spring, the belleville spring has a plurality of ring segments 421 overlapped to each other.

The controller 1 further has at least one flexible ring circle 50 that is in the hollow channel 131 of the hollow tube 13, and the flexible ring circle 50 female-connects to the external portion of the pivotal-connecting section 21, one side of the flexible ring circle 50 is disposed in the ring slot 211 of the pivotal-connecting section 21 in order to let the flexible ring circle 50 be clamped between the hollow tube 13 and the pivotal-connecting section 21; the flexible ring circle 50 is a silicon element or a rubber element.

Please refer to FIG. 4 to FIG. 7, which illustrate a schematic 3-D exploded view of the electrical cylinder controller with the rotational mechanism of the present invention, another schematic 3-D exploded view of the electrical cylinder controller with the rotational mechanism of the present invention, a schematic 3-D partial exploded view of the electrical cylinder controller with the rotational mechanism of the present invention, and a schematic assembly view of the electrical cylinder controller with the rotational mechanism of the present invention. The controller 1 further has a freely-bent flexible supporting rod 60, a light module 70, a transmittance mask 80, and a control module 90.

The freely-bent flexible supporting rod 60 can be arbitrarily bent, and the one end of the freely-bent flexible supporting rod 60 protrudes to become a connecting portion 61, one end of the freely-bent flexible supporting rod 60 connects to one end of the pivotal element 20, the connecting end of the pivotal element (20) is away from the box 10, the connecting portion 61 is fixed and inserted into the through channel 24 of the pivotal element 20.

The light module 70 is disposed in the accommodating room 14 of the box 10 and is adjacent to the first case 11 of the accommodating room 14, and the light module 70 is corresponding to an open 111 of the first case 11; the light module 70 has a printed circuit board 71 and a plurality of light units 72, the plurality of light units 72 are electrically connected to each other and are disposed on the one side surface, adjacent to the first case 11, of the printed circuit board 71.

The transmittance mask 80, corresponding to the open 111, connects to the first case 11, and the light module 70, corresponding to the open 111, emits light toward the transmittance mask 80.

The control module 90 has a control board 91, a plurality of touchable switches 92, a plurality of buttons 93, and at least one electric line 94; one side of the printed circuit board 71 is away from the first case 11 and electrically connects to one side of the control board 91, the connecting side of the control board 91 is away from the second case 12; the touchable switches 92 are disposed on one side, adjacent to the second case 12, of the control board 91; the buttons 93 are respectively disposed in the compartment space 1211 of the ring frame 121 and are disposed on one side, adjacent to the first case 11, of the flexible plate member 122, and the buttons 93 connect to the ring frame 121 and are corresponding to the touchable switches 92; the plurality of pressing portions 1221 of the flexible plate member (122) are corresponding to the buttons 93; the electric line 94 electrically connects to the control board 91 and connects through the through channel 24 of the pivotal element 20, the internal of the freely-bent flexible supporting rod 60, and the electric line 94 electrically connects to an actuator.

Please refer to FIG. 8 to FIG. 11, which illustrate a schematic view of an operation status 1 of the electrical cylinder controller with the rotational mechanism of the present invention, a schematic view of an operation status 2 of the electrical cylinder controller with the rotational mechanism of the present invention, a schematic view of an operation status 3 of the electrical cylinder controller with the rotational mechanism of the present invention, and a schematic view of an operation status 4 of the electrical cylinder controller with the rotational mechanism of the present invention. A medical personnel press the pressing portion 1221 of the flexible plate member 122 of the second case 12 so as to drive the button 93 to actuate the touchable switch 92 for adjusting the extending length of the adjustable rod of the actuator, so that a hospital bed can be adjusted to suit an angle of a patient for a next step of diagnosis or other purposes. While light is a must for medical personnel engaging in diagnoses or other purposes, the box 10 can be applied a force in order to let the box 10 rotate in relative to the pivotal element 20, and thus make the first case 11 of the box 10 face to the patient, hence, the light emitted from the light units 72 of the light module 70 goes out by means of the transmittance mask 80 for the purpose of providing light.

While rotating the box 10 to approach the angle of 360°, the restricting block 132 in the hollow tube 13 and the stopping block 25 of the pivotal element 20 are against to each other for avoiding that the angle of the rotation, corresponding to the pivotal element 20, of the box 10 is over 360°, so that the electric line may not be over twisted to damage; in addition, by way of the box 10 being in a rotation, relative to the pivotal element 20, in any angle, the box 10 of the controller 1 is able to rotate to a suitable angle for the conveniences of medical personnel or patients.

More, for the damping member 40 being clamped between the box 10 and the fixing element 30, the force applied to the box 10 is greater than the friction force between the damping member 40 and the inner wall of the accommodating room 14 or the friction force between the damping member 40 and the fixing element 30, thus the box 10 is just in a rotation relative to the pivotal element 20. It is to avoid that the box 10 arbitrarily rotates while the medical personnel press the pressing portion 1221 of the flexible plate member 122.

For the freely-bent flexible supporting rod 60, the height of the box 10 is adjustable through bending the freely-bent flexible supporting rod 60 so as to let the medical personnel or patient press the pressing portion 1221 of the flexible plate member 122 more easily, and thus the extending length of the adjustable rod of the actuator can be reached more easily for adjusting the angle of the hospital bed.

Further, through the transmittance mask 80 being capable of uniforming light, the light emitted from the light units 72 of the light module 70 going out through the transmittance mask 80 is uniformed in order to avoid glare or intensive light. For the design of the light module 70, additional space for lamps and lanterns can then be saved.

Further more, via the flexible ring circle 50 being clamped between the hollow tube 13 and the pivotal-connecting section 21, mist going into the accommodating space 14 through the gaps of the hollow tube 13 and the pivotal-connecting section 21 is now avoided. Hence the control board 91 and the printed circuit board 71 touching mist to cause corrosion and damage is prevented as well as to promote life.

Although the present invention has been described with reference to the foregoing preferred embodiment, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is:

1. An electrical cylinder controller (1) with a rotational mechanism, the electrical cylinder controller (1) comprising:
   a box (10) having a hollow tube (13) at one end thereof, an interior surface of the hollow tube (13) integrally and immovably formed a restricting block (132), wherein the restricting block (132) protrudes toward an axis of the hollow tube (13);
   a pivotal element (20) having a through channel (24) therein, penetrating through the hollow tube (13), the pivotal element (20) having a pivotal-connecting section (21) and a protruding section (22) elongating from the pivotal-connecting section (21), an external surface of the protruding section (22) concavely formed a slot (221); a stopping block (25) partially embedding in the slot (221) and being against the restricting block (132);
   a freely-bent flexible supporting rod (60), one end of the freely-bent flexible supporting rod (60) connecting with an end of the pivotal element (20), the end of the pivotal element (20) being away from the box (10), wherein the end of the flexible supporting rod (60) protrudes to become a connecting portion (61), a diameter of the connecting portion (61) is the same as that of the through channel (24) so that the connecting portion (61) is immovably fixed into the through channel (24);
   a fixing element (30), connecting to an end portion of the protruding section (22); and
   a damping member (40), female-connecting to the external surface of the protruding section (22) and being clamped between an outer bottom surface of the hollow tube (13) and the fixing element (30).

2. The electrical cylinder controller with the rotational mechanism according to claim 1, wherein the box (10) comprises a first case (11) and a second case (12) corresponding to the first case (11) for covering, an accommodating room (14) is formed between the first case (11) and the second case (12), the hollow tube (13) elongates from one end of the first case (11) and communicating the accommodating room (14), an end portion of the protruding section (22), the fixing element (30) and the damping member (40) are accommodated in the accommodating room (14).

3. The electrical cylinder controller with the rotational mechanism according to claim 2, wherein the hollow tube (13) has a hollow channel (131) connecting through the accommodating room (14), the restricting block (132) elongating from an inner wall of the hollow channel (131).

4. The electrical cylinder controller with the rotational mechanism according to claim 3, wherein the pivotal element (20) inserts through the hollow channel (131).

5. The electrical cylinder controller with the rotational mechanism according to claim 4, wherein the fixing element (30) is a nut, the end portion of the protruding section (22) being shaped as an outer thread (223), the fixing element (30) and the outer thread (223) being screwed to each other.

6. The electrical cylinder controller with the rotational mechanism according to claim 5, wherein the damping member (40) comprises a pair of ring plates (41) corresponding to each other and a spring (42) clamped between the two ring plates (41).

7. The electrical cylinder controller with the rotational mechanism according to claim 6, wherein the spring is a belleville spring, the belleville spring comprising a plurality of ring segments (421) overlapped to each other.

8. The electrical cylinder controller with the rotational mechanism according to claim 6 further comprising at least one flexible ring circle (50), the flexible ring circle (50) being in the hollow channel (131), female-connecting with an external portion of the pivotal-connecting section (21) and being clamped between the hollow tube (13) and the pivotal-connecting section (21).

9. The electrical cylinder controller with the rotational mechanism according to claim 6, wherein an external surface of the pivotal-connecting section (21) has at least one ring slot (211) for accommodating at least one flexible ring circle (50).

10. The electrical cylinder controller with the rotational mechanism according to claim 9, wherein the flexible ring circle (50) is a silicon element or a rubber element.

11. The electrical cylinder controller with the rotational mechanism according to claim 2, wherein the through channel (24) connects through the accommodating room (14).

12. The electrical cylinder controller with the rotational mechanism according to claim 11 further comprising a light module (70) and a control module (90), the light module (70) being disposed in the accommodating room (14) and being adjacent to the first case (11), the control module (90) being disposed in the accommodating room (14) and being adjacent to the second case (12), the light module (70) electrically connecting with the control module (90).

13. The electrical cylinder controller with the rotational mechanism according to claim 12 further comprising a transmittance mask (80), the first case (11) having an open (111) communicating with the accommodating room (14), the transmittance mask (80), corresponding to the open (111), connecting with the first case (11), the light module (70), corresponding to the open (111), emitting light toward the transmittance mask (80).

14. The electrical cylinder controller with the rotational mechanism according to claim 13, wherein the light module (70) comprises a printed circuit (PC) board (71) and a plurality of light units (72), the plurality of light units (72) being electrically connected to each other and being disposed on one side surface, adjacent to the first case (11), of the PC board (71), the light units (72) emitting light toward the transmittance mask (80).

15. The electrical cylinder controller with the rotational mechanism according to claim 14, wherein the control module (90) comprises a control board (91), one side of the PC board (71) being away from the first case (11) and electrically connecting with one side of the control board (91), the connecting side of the control board (91) being away from the second case (12).

16. The electrical cylinder controller with the rotational mechanism according to claim 15, wherein the control module (90) further comprises a plurality of touchable switches (92), the touchable switches (92) being disposed on one side, adjacent to the second case (12), of the control board (91).

17. The electrical cylinder controller with the rotational mechanism according to claim 16, wherein the second case (12) comprises a ring frame (121), the peripheral of the ring frame (121) forming a compartment space (1211), the control module (90) further comprising a plurality of buttons (93), the buttons (93) being respectively disposed in the compartment space (1211), and connecting with the ring frame (121), the buttons (93) being corresponding to the touchable switches (92).

18. The electrical cylinder controller with the rotational mechanism according to claim 17, wherein the second case (12) further comprises a flexible plate member (122), the flexible plate member (122) connecting with the ring frame (121) corresponding to the compartment space (1211) and being disposed on one side, away from the touchable switches (92), of the buttons (93).

19. The electrical cylinder controller with the rotational mechanism according to claim 18, wherein a plurality of pressing portions (1221) are disposed above and corresponding to the plurality of buttons (93) on one side surface, away from the ring frame (121), of the flexible plate member (122).

* * * * *